United States Patent [19]

Tamagawa

[11] Patent Number: 5,254,487
[45] Date of Patent: Oct. 19, 1993

[54] METHOD OF MANUFACTURING HIGH AND LOW VOLTAGE CMOS TRANSISTORS ON A SINGLE CHIP

[75] Inventor: Akio Tamagawa, Tokyo, Japan
[73] Assignee: NEC Corporation, Tokyo, Japan
[21] Appl. No.: 21,028
[22] Filed: Feb. 23, 1993

[30] Foreign Application Priority Data

May 13, 1992 [JP] Japan .................. 4-119456

[51] Int. Cl.⁵ ........................................... H01L 21/266
[52] U.S. Cl. .......................... 437/34; 437/45; 437/152
[58] Field of Search ............... 437/34, 45, 57, 58, 437/59, 152; 148/DIG. 9, DIG. 13, DIG. 126

[56] References Cited

U.S. PATENT DOCUMENTS 4,403,395  9/1985  Curran .................................. 437/45
4,628,341 12/1986  Thomas ....................... 148/DIG. 9
5,024,960  6/1991  Haken ................................... 437/34
5,047,358  9/1991  Kosiak et al. ....................... 437/34
5,156,989 10/1992  Williams et al. .................... 437/57
5,158,463 10/1992  Kim et al. ............................ 437/34

Primary Examiner—Tom Thomas
Assistant Examiner—Chandra Chaudhari
Attorney, Agent, or Firm—Whitham & Marhoefer

[57] ABSTRACT

A semiconductor device where high voltage CMOS transistors and low voltage CMOS transistors are installed on a single chip, is manufactured by a silicon gate CMOS process. In order to reduce the number of repetitions of photolithographic process, low voltage N channel transistor domains and high voltage P channel transistor domains are simultaneously implanted by B ion, and low voltage P channel transistor domains and high voltage N channel transistor domains are simultaneously implanted by P ion.

12 Claims, 2 Drawing Sheets

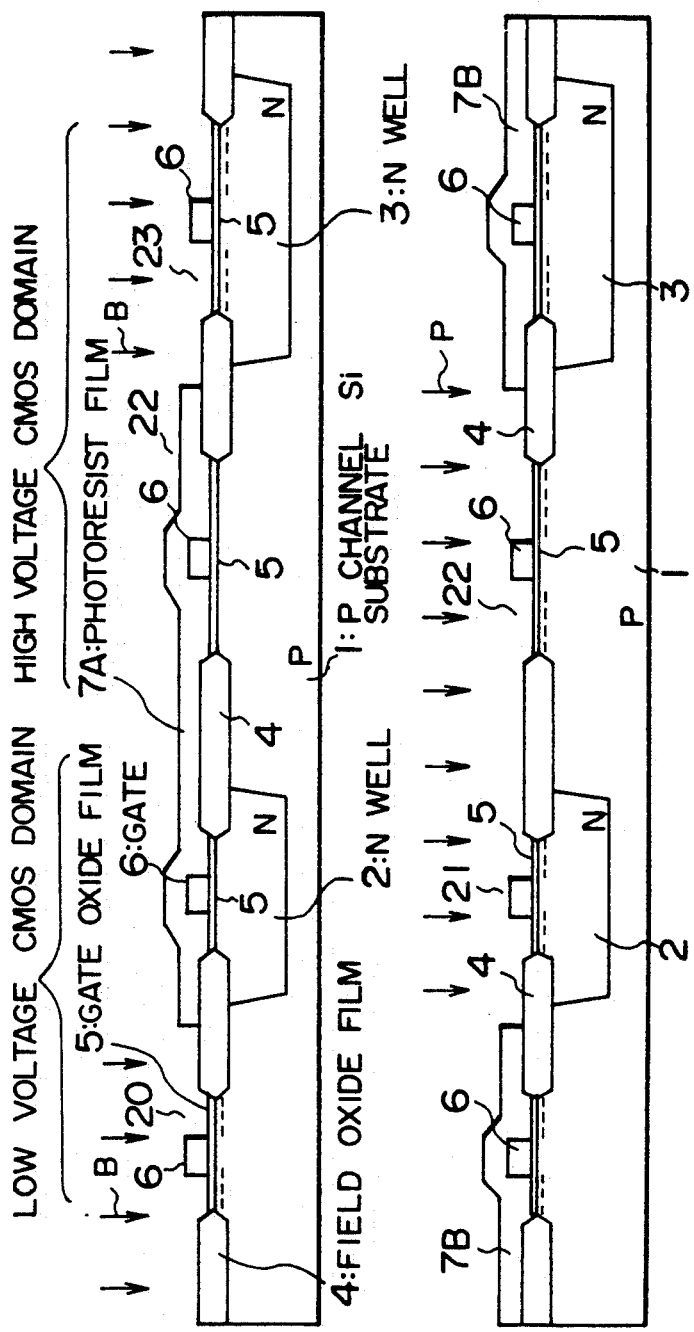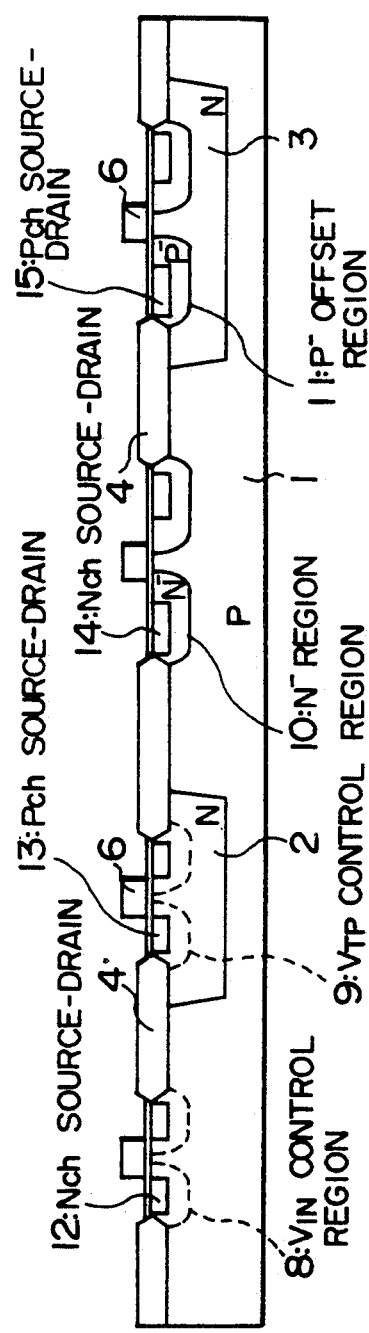
FIG.1(a)
FIG.1(b)
FIG.1(c)

METHOD OF MANUFACTURING HIGH AND LOW VOLTAGE CMOS TRANSISTORS ON A SINGLE CHIP

BACKGROUND OF THE INVENTION

This invention relates to a method of manufacturing a semiconductor device, and more particularly a semiconductor device where high voltage CMOS(complementary metal oxide semiconductor) transistors and low voltage CMOS transistors are installed on a same chip.

Standard power supply voltage of an LSI(large scale IC) used with a microcomputer is 5 V. But, LSIs for car control and LSIs for driving liquid crystal display panels, work under voltages higher than 10 V, and these LSIs must withstand at least 20 V and more.

Heretofore, aluminum gate CMOS process has been used for these high voltage LSIs, in which source-drain junctions are relatively deep(one to several μm) and gate oxide films are thick(about 100 nm). This process is not adapted for miniaturization because a self alignment process is not applicable for forming a gate electrode and corresponding source-drain and because the source-drain junction is deep.

By a silicon gate CMOS process, which is mainly employed in current practices, a gate electrode and corresponding source-drain are produced by self alignment process making miniaturization and high speed performance feasible. High withstand voltage is obtained by providing a low density diffusion region in a drain domain for field intensity relaxation.

Using this silicon gate CMOS process and installing low voltage CMOS transistors for use as internal logics where miniaturization and high speed operation is required, and high voltage CMOS transistors for use as input and output circuits on a single chip, miniaturization, high speed operation, and high withstand voltage are made feasible, and these semiconductor devices can be used as LSIs for car control and LSIs for driving liquid crystal display panels.

Heretofore known process of manufacturing these silicon gate CMOS transistors will be briefly described;

(p-a) on a P type silicon substrate, N wells for low voltage P channel transistors and N wells for high voltage P channel transistors are formed by ion implantation and thermal diffusion, (p-b) field oxide films for isolation between elements are formed by selective oxidation, (p-c) gate oxide films are formed, (p-d) masking with photoresist film patterned by a photolithographic process, B ion is implanted in low voltage N channel transistor domains for controlling threshold voltage, (p-e) masking with photoresist film patterned by a photolithographic process, B ion is implanted in low voltage P channel transistor domains for controlling threshold voltage, (p-f) masking with photoresist film patterned by a photolithographic process, B ion is implanted in high voltage N channel transistor domains for controlling threshold voltage, (p-g) masking with photoresist film patterned by a photolithographic process, B ion is implanted in high voltage P channel transistor domains for controlling threshold voltage, (p-h) a polysilicon film is generated on the whole surface of the wafer, and gate electrodes of all transistors are formed by selective etching in a photolithographic process, (p-i) masking with the gate electrodes and photoresist film patterned by a photolithographic process, B ion is implanted in high voltage P channel transistor domains for forming low density diffusion regions working as field intensity relaxation regions, (p-j) masking with the gate electrodes and photoresist film patterned by a photolithographic process, P ion is implanted in high voltage N channel transistor domains for forming low density diffusion regions working as field intensity relaxation regions, (p-k) by heat treatment, a N⁻ region for field intensity relaxation in each high voltage N channel transistor domain and a P⁻ region for field relaxation in each high voltage P channel transistor domain are generated.

(p-l) masking with photoresist films patterned by photolithographic processes, B ion is implanted in low voltage P channel transistor domains and high voltage P channel transistor domains, and As ion is implanted in low voltage N channel transistor domains and high voltage N channel transistor domains, (p-m) by heat treatment, all the sources and drains for every channel transistors are formed, the sources and the drains of low voltage transistors being formed by self alignment and the sources and drains of high voltage transistors are formed several μm apart from the gate electrode, as are usually called offset gate type MOS transistors.

In the prior art method, there are four photolithographic processes repeated for ion implantation of controlling threshold voltages in each type of channels as described in (p-d), (p-e), (p-f) and (p-g), and two photolithographic processes repeated for forming low density diffusion regions as described in (p-i) and (p-j). In a photolithographic process, photoresist is painted on the whole surface, patterned for exposing selected areas, and removed after the implantation process is over. This takes a lot of time and cost, and the six repeated photolithographic process makes the whole manufacturing cost higher.

BRIEF DESCRIPTION OF THE INVENTION

Therefore, a primary object of the present invention is to provide a method of manufacturing semiconductor devices with reduced number of repetitions of photolithographic processes.

In this invention, N wells for low voltage transistor domains and N wells for high voltage transistor domains, and field oxide films and gate oxide films are generated as described in (p-a), (p-b) and (p-c). B ion is implanted in high voltage N channel transistor domains and in high voltage P channel transistor domains for controlling threshold voltages as described in (p-f) and (p-g).

And then, gate electrodes are formed as described in (p-h). In the next process, low voltage N channel transistor domains and high voltage P channel transistor domains are implanted by B ion in a single photolithographic process, for controlling the threshold voltage and for field intensity relaxation. Low voltage P channel transistor domains and high voltage N channel transistor domains are also implanted by P ion in a single photolithographic process.

BRIEF DESCRIPTION OF THE DRAWINGS

Further objects, features, and advantages of this invention will become apparent from consideration of the following description of the appended claims, and the accompanying drawings in which the same numerals indicate the same or the corresponding parts.

FIGS. 1(a) to 1(c) show crosssectional views of a first embodiment of this invention illustrating steps of manufacturing processes.

DETAILED DESCRIPTION OF THE PREFERRED EMBODIMENTS

Figure 2A:
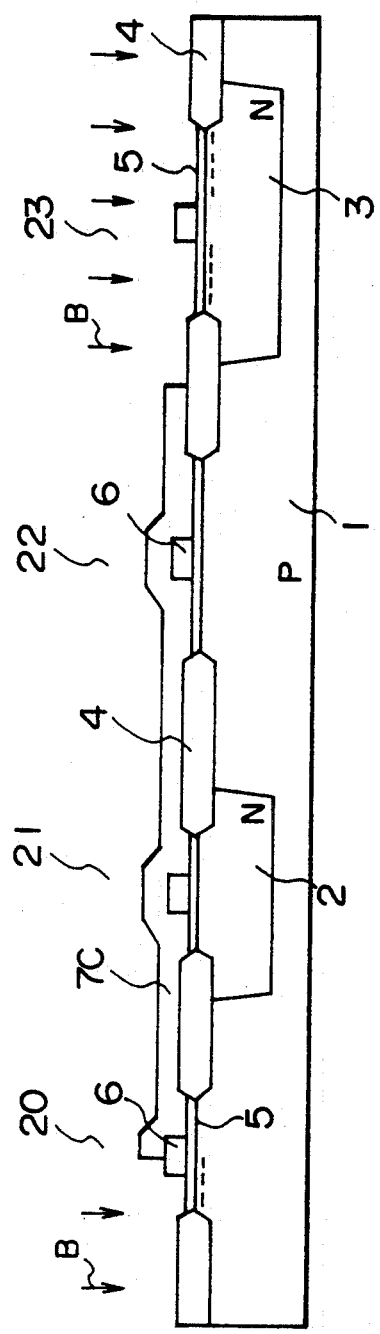
FIGS. 2(a) to 2(c) show crosssectional views of a second embodiment of this invention illustrating steps of manufacturing processes.

Steps of manufacturing processes in the first embodiment of this invention will be described in connection with FIGS. 1(a) to 1(c).

(A) In a P type Si substrate 1, N wells 2 for low voltage P channel transistors and N wells 3 for high voltage P channel transistors are formed by ion implantation and thermal diffusion. The impurity profiles of the N wells 2 and the N wells 3 are determined in accordance with the withstand voltage required for the element. The surface density of the N wells 2 is usually determined at about $10^{16} \sim 10^{17} cm^{-3}$ and that of the N wells 3 is at about $5 \times 10^{15} \sim 5 \times 10^{16} cm^{-3}$. The depth of the junction is usually from several to ten and several μm.

(B) Then, field oxide films 4 for separating elements are formed. Next, gate oxide films are formed. B ion for controlling threshold voltage is implanted in high voltage N channel MOS transistor domains 22 and high voltage P channel MOS transistor domains 23 successively as described in (p-f) and (p-g) for prior art method.

(C) A polysilicon film is generated on the whole surface of the wafer, and gate electrodes 6 of all transistors are formed by selective etching.

(D) In a next process, a photoresist film 7A is painted on the whole surface of the wafer, and photolithographically processed to expose low voltage N channel transistor domains 20 and high voltage P channel transistor domains 23. B ion is implanted in the low voltage N channel transistor domains 20 for controlling the threshold voltage and in the high voltage P channel transistor domains 23 for field intensity relaxation. Usually, the amount of dose is about $10^{12} \sim 10^{13} cm^{-2}$, and both domains 20 and 23 are masked by the gate electrodes 6. This step is illustrated in FIG. 1(a), and it is noted that this step is carried out in two steps described in (p-d) and (p-i) in the prior art method.

(E) In a following process as shown in FIG. 1(b), masking with photoresist 7B and gate electrodes 6, P ion is implanted in the low voltage P channel transistor domains 21 for controlling the threshold voltage and in the high voltage N channel transistor domains 22 for field intensity relaxation. Usually, the amount of dose is about $10^{12} \sim 10^{13} cm^{-2}$. It is noted that this step is carried out in two steps described in (p-e) and (p-j) in the prior art method.

(F) In a next process as shown in FIG. 1(c), a N⁻ region 10 for field intensity relaxation in each high voltage N channel transistor domain 22, a P⁻ region 11 for field intensity relaxation in each high voltage P channel transistor domain 23, a threshold voltage control region 8 in each low voltage N channel transistor domain 20, and a threshold voltage control region 9 in each low voltage P channel transistor domain 21 are produced by heat treatment at 1100°~1200° C. for a duration from three quarter to one hour.

(G) Then, masking with photoresist film patterned by a photolithographic process, B ion is implanted in the low voltage P channel transistor domains 21 and in the high voltage P channel transistor domains 23. Next, masking with photoresist film patterned by a photolithographic process, As ion is implanted in the low voltage As channel transistor domains 20 and in the high voltage N channel transistor domains 22.

(H) By heat treatment, source-drains 12, 13, 14, 15 for all channels are produced.

The junction depth of N⁻ region 10 and P⁻ region 11 for field intensity relaxation is from one to several μm. The threshold voltage control regions 8 and 9 are diffused to have a depth of a same order. The impurities diffuse in lateral direction and reach directly under the gate electrodes 6 of low voltage transistors enabling the threshold voltage control.

As the source-drain regions of low voltage transistors are covered with domains having higher impurity densities than the substrate 1, depletion layers spreading from drains when voltage is impressed, are constrained to keep the punch-through voltage higher. This is effective for a fine process where the gate length of the low voltage transistors is about 1~2 μm, because withstand voltage of transistors with short gate length is determined by punch-through voltage between source-drain.

The second embodiment of this invention will be described in connection to FIGS. 2(a) to 2(c).

Steps (A2), (B2), (C2) are the same with the steps (A), (B), (C) of the first embodiment.

In step (D2) corresponding to step (D) of the first embodiment, as shown in FIG. 2(a), source regions of low voltage N channel transistors 20 and high voltage P channel transistor domains 23 are implanted by B ion.

Figure 2B:
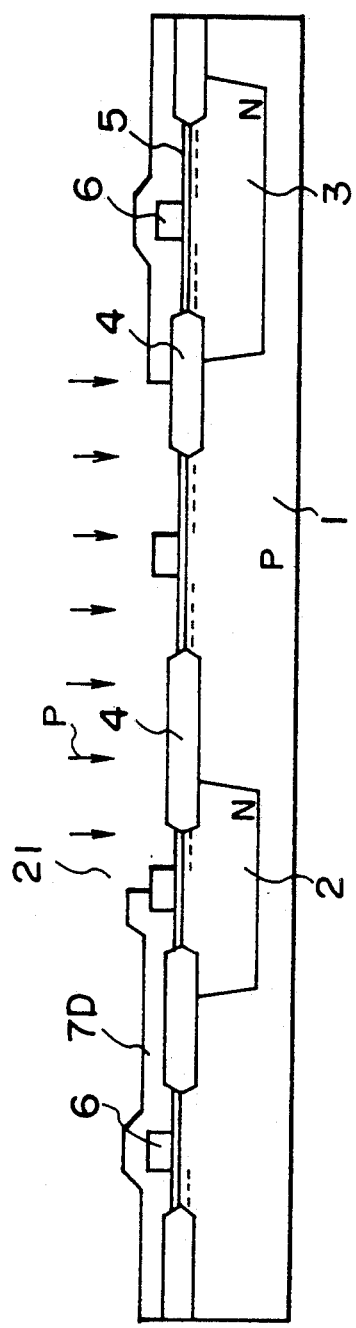
Figure 2C:
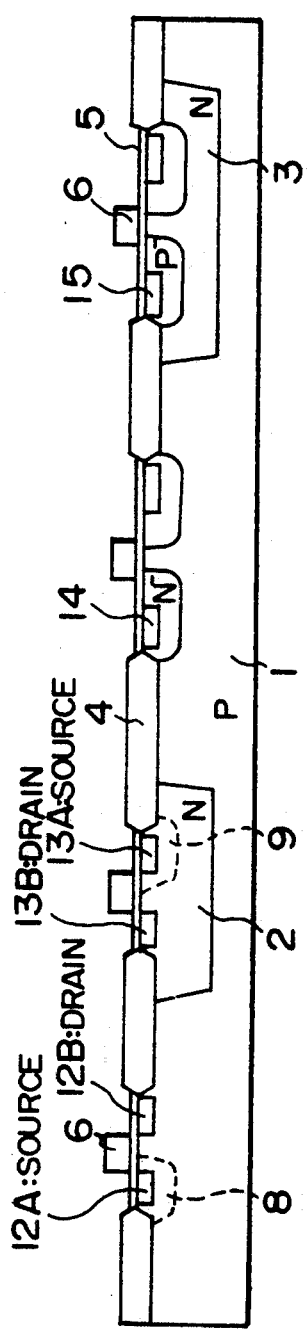

In step (E2) corresponding to step (E) of the first embodiment, as shown in FIG. 2(b), source regions of low voltage P channel transistors 21 and high voltage N channel transistor domains 22 are implanted by P ion.

Following steps are similar to the steps (F), (G), (H) of the first embodiment, and threshold voltage control regions 8 and 9 are produced in each source region of a low voltage N channel transistor 20 and in each source region of a low voltage P channel transistor 21. And sources 12A, 13A and drains 12B, 13B of low voltage CMOS transistors and source-drains 14, 15 of high voltage transistors are formed as illustrated in FIG. 2(c).

In the second embodiment, a high impurity region for threshold voltage control is not formed in a drain region of a low voltage transistor, and low voltage transistors can withstand higher voltages. Spreading of depletion layers is not constrained in this construction, and in order to prevent punch-through between source-drain, the gate length of a low voltage transistor must be relatively long, for example must be about 3~5 μm.

In the foregoing descriptions, step (D) precedes step (E) in the first embodiment, and step (D2) precedes step (E2) in the second embodiment, but the sequence of these two steps can be reversed.

As described in the foregoing paragraphs, two photolithographic processes can be omitted by the method of the present invention in the effect of substantially reducing the production cost.

So far, this invention has been described on a semiconductor device with P type substrate and N wells.

But it is a matter of course that this invention can be applied on a semiconductor device with N type substrate and P wells.

What is claimed is:

1. Method of manufacturing a semiconductor device where high voltage CMOS transistors and low voltage CMOS transistors are installed on a same chip, by a silicon gate CMOS process, characterized in that the method comprises:

process of forming N wells for low voltage P channel transistors and for high voltage P channel transistors in a P type Si substrate, by ion implantation and thermal diffusion, process of forming field oxide films for separating elements and gate oxide films, process of B ion implantation in high voltage N channel transistor domains for controlling threshold voltage, process of B ion implantation in high voltage P channel transistor domains for controlling threshold voltage, process of forming gate electrodes by generating a polysilicon film and by etching said polysilicon film selectively, process of simultaneous B ion implantation in low voltage N channel transistor domains for controlling threshold voltage and in high voltage P channel transistor domains for field intensity relaxation, process of simultaneous P ion implantation in low voltage P channel transistor domains for controlling threshold voltage and in high voltage N channel transistor domains for field intensity relaxation.

2. Method of manufacturing a semiconductor device according to claim 1, in which said process of simultaneous B ion implantation precedes said process of simultaneous P ion implantation.

3. Method of manufacturing a semiconductor device according to claim 1, in which said process of simultaneous P ion implantation precedes said process of simultaneous B ion implantation.

4. Method of manufacturing a semiconductor device where high voltage CMOS transistors and low voltage CMOS transistors are installed on a same chip, by a silicon gate CMOS process, characterized in that the method comprises:

process of forming N wells for low voltage P channel transistors and for high voltage P channel transistors in a P type Si substrate, by ion implantation and thermal diffusion, process of forming field oxide films for separating elements and gate oxide films, process of B ion implantation in high voltage N channel transistor domains for controlling threshold voltage, process of B ion implantation in high voltage P channel transistor domains for controlling threshold voltage, process of forming gate electrodes by generating a polysilicon film and by etching said polysilicon film selectively, process of simultaneous B ion implantation in low voltage N channel transistor source regions for controlling threshold voltage and in high voltage P channel transistor domains for field intensity relaxation, process of simultaneous P ion implantation in low voltage P channel transistor source regions for controlling threshold voltage and in high voltage N channel transistor domains for field intensity relaxation.

5. Method of manufacturing a semiconductor device according to claim 4, in which said process of simultaneous B ion implantation precedes said process of simultaneous P ion implantation.

6. Method of manufacturing a semiconductor device according to claim 4, in which said process of simultaneous P ion implantation precedes said process of simultaneous B ion implantation.

7. Method of manufacturing a semiconductor device where high voltage CMOS transistors and low voltage CMOS transistors are installed on a same chip, by a silicon gate CMOS process, characterized in that the method comprises:

process of forming P wells for low voltage N channel transistors and for high voltage N channel transistors in an N type Si substrate, by ion implantation and thermal diffusion, process of forming field oxide films for separating elements and gate oxide films, process of P ion implantation in high voltage P channel transistor domains for controlling threshold voltage, process of P ion implantation in high voltage N channel transistor domains for controlling threshold voltage, process of forming gate electrodes by generating a polysilicon film and by etching said polysilicon film selectively, process of simultaneous P ion implantation in low voltage P channel transistor domains for controlling threshold voltage and in high voltage N channel transistor domains for field intensity relaxation, process of simultaneous B ion implantation in low voltage N channel transistor domains for controlling threshold voltage and in high voltage P channel transistor domains for field intensity relaxation.

8. Method of manufacturing a semiconductor device according to claim 7, in which said process of simultaneous P ion implantation precedes said process of simultaneous B ion implantation.

9. Method of manufacturing a semiconductor device according to claim 7, in which said process of simultaneous B ion implantation precedes said process of simultaneous P ion implantation.

10. Method of manufacturing a semiconductor device where high voltage CMOS transistors and low voltage CMOS transistors are installed on a same chip, by a silicon gate CMOS process, characterized in that the method comprises:

process of forming P wells for low voltage N channel transistors and for high voltage N channel transistors in an N type Si substrate, by ion implantation and thermal diffusion, process of forming field oxide films for separating elements and gate oxide films, process of P ion implantation in high voltage P channel transistor domains for controlling threshold voltage, process of P ion implantation in high voltage N channel transistor domains for controlling threshold voltage, process of forming gate electrodes by generating a polysilicon film and by etching said polysilicon film selectively, process of simultaneous P ion implantation in low voltage P channel transistor source regions for controlling threshold voltage and in high voltage N channel transistor domains for field intensity relaxation, process of simultaneous B ion implantation in low voltage N channel transistor source regions for controlling threshold voltage and in high voltage P channel transistor domains for field intensity relaxation.

11. Method of manufacturing a semiconductor device according to claim 10, in which said process of simultaneous P ion implantation precedes said process of simultaneous B ion implantation.

12. Method of manufacturing a semiconductor device according to claim 10, in which said process of simultaneous B ion implantation precedes said process of simultaneous P ion implantation.

* * * * *